United States Patent

Patel et al.

(10) Patent No.: US 10,033,337 B2
(45) Date of Patent: Jul. 24, 2018

(54) MULTI-STAGE BANDPASS LOW-NOISE AMPLIFIER

(71) Applicant: QUALCOMM Incorporated, San Diego, CA (US)

(72) Inventors: Chirag Dipak Patel, San Diego, CA (US); Sasha Vujcic, San Diego, CA (US); Aleksandar Miodrag Tasic, San Diego, CA (US); Timothy Gathman, San Diego, CA (US); Wu-Hsin Chen, San Diego, CA (US); Klaas Van Zalinge, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/287,674

(22) Filed: Oct. 6, 2016

(65) Prior Publication Data

US 2018/0048271 A1    Feb. 15, 2018

Related U.S. Application Data

(60) Provisional application No. 62/372,715, filed on Aug. 9, 2016.

(51) Int. Cl.
*H03F 3/68* (2006.01)
*H03F 3/19* (2006.01)
(Continued)

(52) U.S. Cl.
CPC .............. *H03F 3/19* (2013.01); *H03F 3/68* (2013.01); *H03H 7/06* (2013.01); *H03H 11/04* (2013.01); *H03F 2200/168* (2013.01); *H03F 2200/294* (2013.01); *H03F 2200/451* (2013.01); *H04W 88/02* (2013.01)

(58) Field of Classification Search
CPC .................. H03F 1/26; H03F 3/191
USPC ........ 330/295, 124 R, 84, 144, 69, 277, 311, 330/302, 303, 306
See application file for complete search history.

(56) References Cited

U.S. PATENT DOCUMENTS 6,954,106 B2 * 10/2005 Miyagi ............... H03F 3/16
330/277
7,027,791 B2    4/2006 Twomey
(Continued)

FOREIGN PATENT DOCUMENTS

CN    104270101        1/2015
JP    59226527 A  * 12/1984
WO   2015163971 A2   10/2015

OTHER PUBLICATIONS

International Search Report and Written Opinion—PCT/US2017/042442—ISA/EPO—dated Oct. 18, 2017.
(Continued)

*Primary Examiner* — Khanh V Nguyen
*Assistant Examiner* — Kheim Nguyen
(74) *Attorney, Agent, or Firm* — Qualcomm Incorporated/Seyfarth Shaw LLP

(57) ABSTRACT

A multi-stage low-noise amplifier (LNA) device with a band pass response includes a first LNA in series with a second LNA. The device further includes multiple outputs coupled to the second LNA. Each of the outputs is capable of being active at the same time. The device further includes a high pass filter coupled between the first LNA and the second LNA.

17 Claims, 10 Drawing Sheets

(51) Int. Cl.
    *H03H 7/06*     (2006.01)
    *H03H 11/04*     (2006.01)
    *H04W 88/02*     (2009.01)

(56) References Cited

U.S. PATENT DOCUMENTS

| | | |
|---|---|---|
| 7,595,693 B2 | 9/2009 | Wiklund |
| 8,242,841 B2 | 8/2012 | Zhang |
| 9,025,709 B2 | 5/2015 | Liao et al. |
| 2013/0315348 A1 | 11/2013 | Tasic et al. |
| 2014/0170999 A1 | 6/2014 | Aparin et al. |
| 2016/0142027 A1 | 5/2016 | Yu et al. |

OTHER PUBLICATIONS

Karki J., "Analysis of the Sallen-Key Architecture", Sep. 30, 2002, pp. 1-18, XP055414296, Retrieved from the Internet: URL:http://www.ti.com/lit/an/sloa024b/sloa024b.pdf, [retrieved on Oct. 10, 2017].

\* cited by examiner

Passive Implementation

Active Implementation

US 10,033,337 B2

MULTI-STAGE BANDPASS LOW-NOISE AMPLIFIER

CROSS-REFERENCE TO RELATED APPLICATION

The present application claims the benefit of U.S. Provisional Patent Application No. 62/372,715, filed on Aug. 9, 2016, and titled "MULTI-STAGE BANDPASS LOW-NOISE AMPLIFIER," the disclosure of which is expressly incorporated by reference herein in its entirety.

BACKGROUND

Field

The present disclosure relates generally to wireless communication systems, and more specifically, to a multi-stage low-noise amplifier (LNA) with a bandpass frequency response configured to facilitate carrier aggregation (CA).

Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal via the antenna and may amplify and process the received RF signal to recover data sent by the base station.

A wireless device may support carrier aggregation, which is simultaneous operation on multiple carriers. A carrier may refer to a range of frequencies used for communication and may be associated with certain characteristics. For example, a carrier may be associated with system information describing operation on the carrier. A carrier may also be referred to as a component carrier (CC), a frequency channel, a cell, etc. It is desirable to efficiently support carrier aggregation by the wireless device.

SUMMARY

In an aspect of the present disclosure, a multi-stage low-noise amplifier (LNA) device with a band pass response includes a first LNA in series with a second LNA. The device further includes multiple outputs coupled to the second LNA. Each of the outputs is capable of being active at the same time. The device further includes a high pass filter coupled between the first LNA and the second LNA.

In another aspect of the present disclosure, a method of wireless communication includes amplifying a radio frequency signal at a first stage of a multi-stage low-noise amplifier (LNA). The method further includes low pass filtering an output from the first stage of the multi-stage LNA to generate a low pass filtered output. The method further includes amplifying and inverting the low pass filtered output to produce an inverted output. The method also includes combining the inverted output with the output from the first stage to generate a combined output to cancel low frequency components of the output of the first stage and produce a band pass response.

In yet another aspect of the present disclosure, a multi-stage low-noise amplifier (LNA) apparatus with a band pass response is presented. The apparatus includes means for amplifying a radio frequency signal at a first stage of the multi-stage LNA. The apparatus also includes means for low pass filtering an output from the first stage of the multi-stage LNA to generate a low pass filtered output. The apparatus additionally includes means for amplifying and inverting the low pass filtered output to produce an inverted output. The apparatus further includes means for combining the inverted output with the output of the first stage to generate a combined output to cancel low frequency components of the output of the first stage.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

The detailed description set forth below in connection with the appended drawings is intended as a description of exemplary embodiments and is not intended to represent the only embodiments that can be practiced. The term "exemplary" used throughout this description means "serving as an example, instance, or illustration," and should not necessarily be construed as preferred or advantageous over other exemplary embodiments. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

The detailed description includes specific details for the purpose of providing a thorough understanding of the exemplary embodiments. It will be apparent to those skilled in the art that the exemplary embodiments may be practiced without these specific details. In some instances, well-known structures and devices are shown in block diagram form in order to avoid obscuring the novelty of the exemplary embodiments presented herein. Other aspects, as well as features and advantages of various aspects, will become apparent to those of skill in the art through consideration of the ensuing description, the accompanying drawings and the appended claims.

Figure 1:
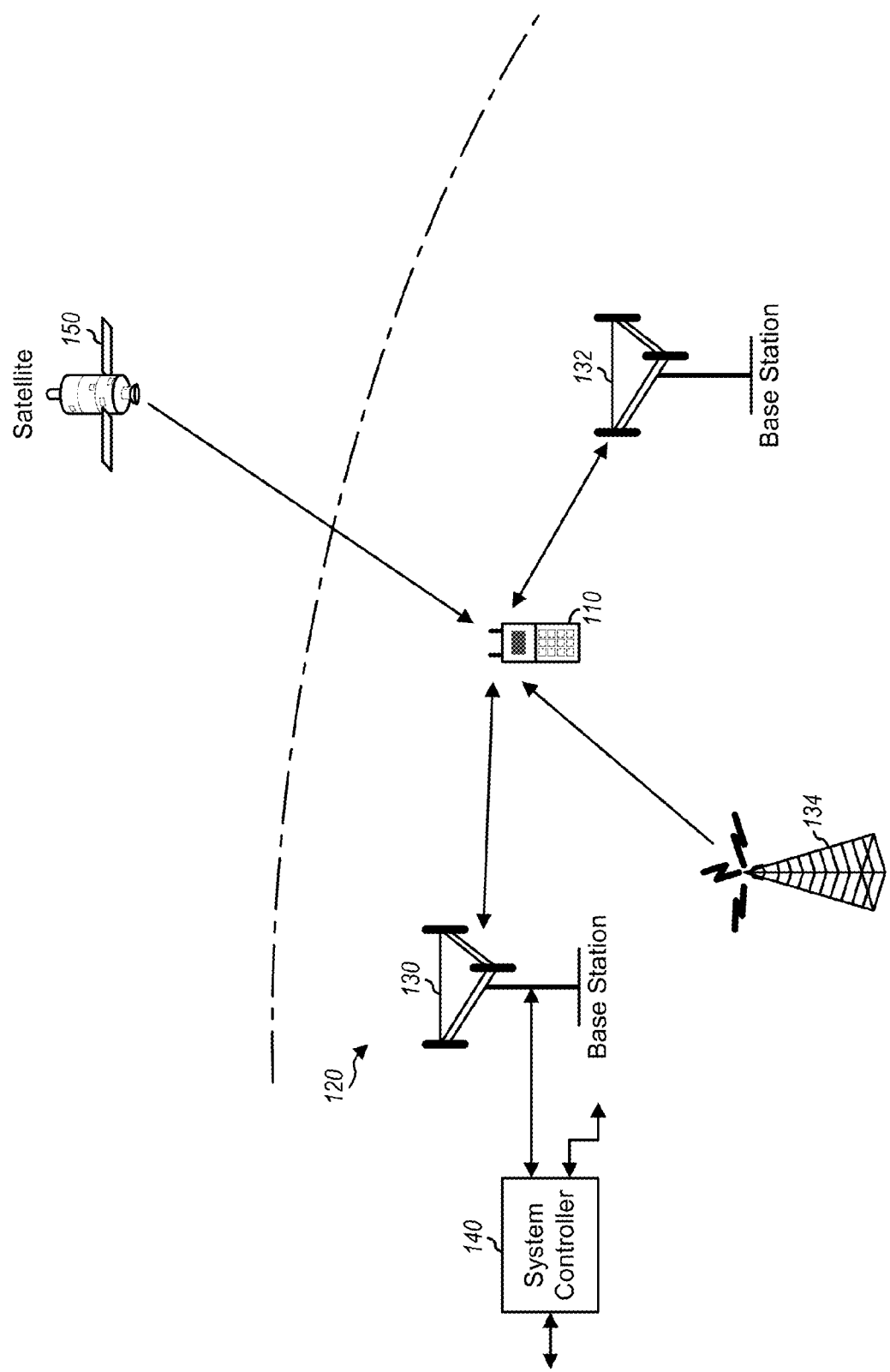
FIG. 1 shows a wireless device communicating with a wireless system, according to an aspect of the present disclosure.

FIG. 1 shows a wireless device 110 communicating with a wireless communication system 120. The wireless system 120 may be a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless system 120 including two base stations 130 and 132 and one system controller 140. In general, a wireless system may include any number of base stations and any number of network entities.

A wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. The wireless device 110 may be capable of communicating with the wireless system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

In general, carrier aggregation (CA) may be categorized into two types: intra-band CA and inter-band CA. Intra-band CA refers to operation on multiple carriers within the same band and inter-band CA refers to operation on multiple carriers in different bands.

Figure 2A:
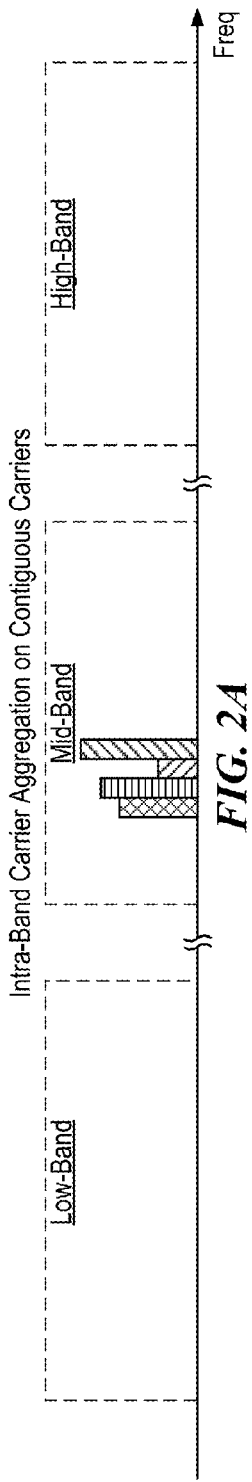
FIGS. 2A, 2B, 2C, and 2D show four examples of carrier aggregation (CA), according to aspects of the present disclosure.

FIG. 2A shows an example of contiguous intra-band CA. In the example shown in FIG. 2A, a wireless device (e.g., the wireless device 110) is configured with four contiguous carriers in the same band, which is a band in mid-band. The wireless device may send and/or receive transmissions on multiple contiguous carriers within the same band.

Figure 2B:
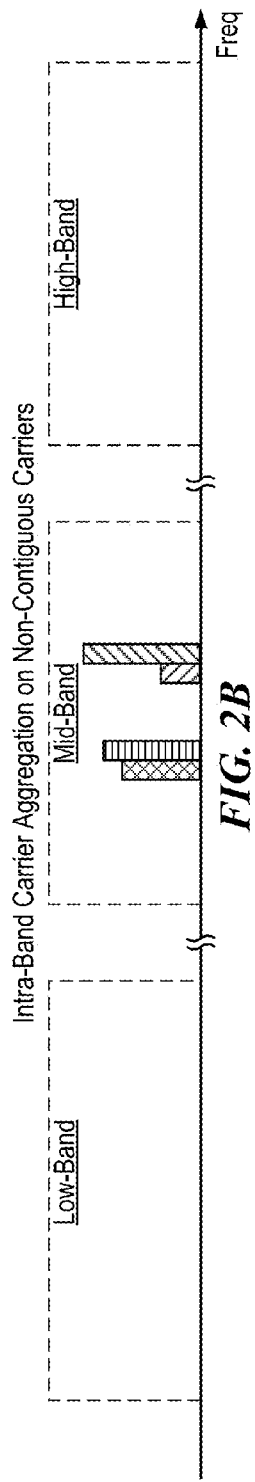

FIG. 2B shows an example of non-contiguous intra-band CA. In the example shown in FIG. 2B, a wireless device (e.g., the wireless device 110) is configured with four non-contiguous carriers in the same band, which is a band in mid-band. The carriers may be separated by 5 MHz, 10 MHz, or some other amount. The wireless device may send and/or receive transmissions on multiple non-contiguous carriers within the same band.

Figure 2C:
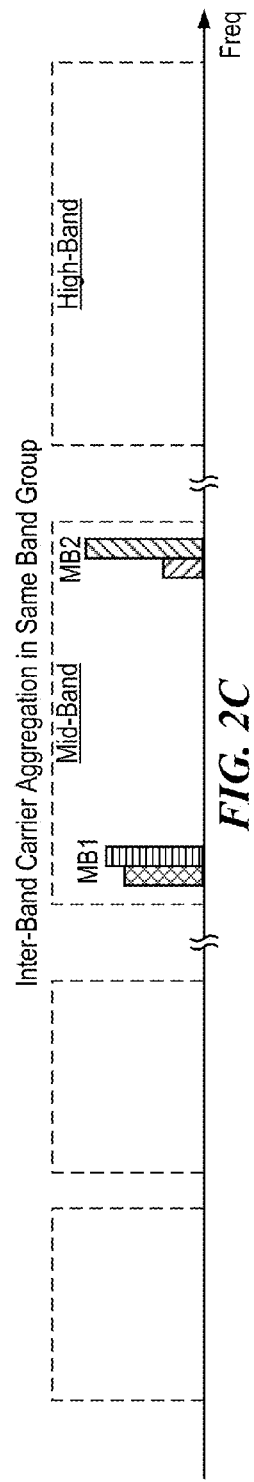

FIG. 2C shows an example of inter-band CA in the same band group. In the example shown in FIG. 2C, a wireless device (e.g., the wireless device 110) is configured with four carriers in two bands in the same band group, which is mid-band. The wireless device may send and/or receive transmissions on multiple carriers in different bands in the same band group (e.g., Mid-Band 1 (MB1) and Mid-Band 2 (MB2) in FIG. 2C).

Figure 2D:

FIG. 2D shows an example of inter-band CA in different band groups. In the example shown in FIG. 2D, a wireless device (e.g., the wireless device 110) is configured with four carriers in two bands in different band groups, which include two carriers in one band in low-band and two additional carriers in another band in mid-band. The wireless device may send and/or receive transmissions on multiple carriers in different bands in different band groups (e.g., low-band and mid-band in FIG. 2D). FIGS. 2A to 2D show four examples of carrier aggregation. Carrier aggregation may also be supported for other combinations of bands and band groups. For example, carrier aggregation may be supported for low-band and high-band, mid-band and high-band, high-band and high-band, and other band combinations with ultra-high band and long-term evolution in unlicensed spectrum (LTE-U).

Figure 3:
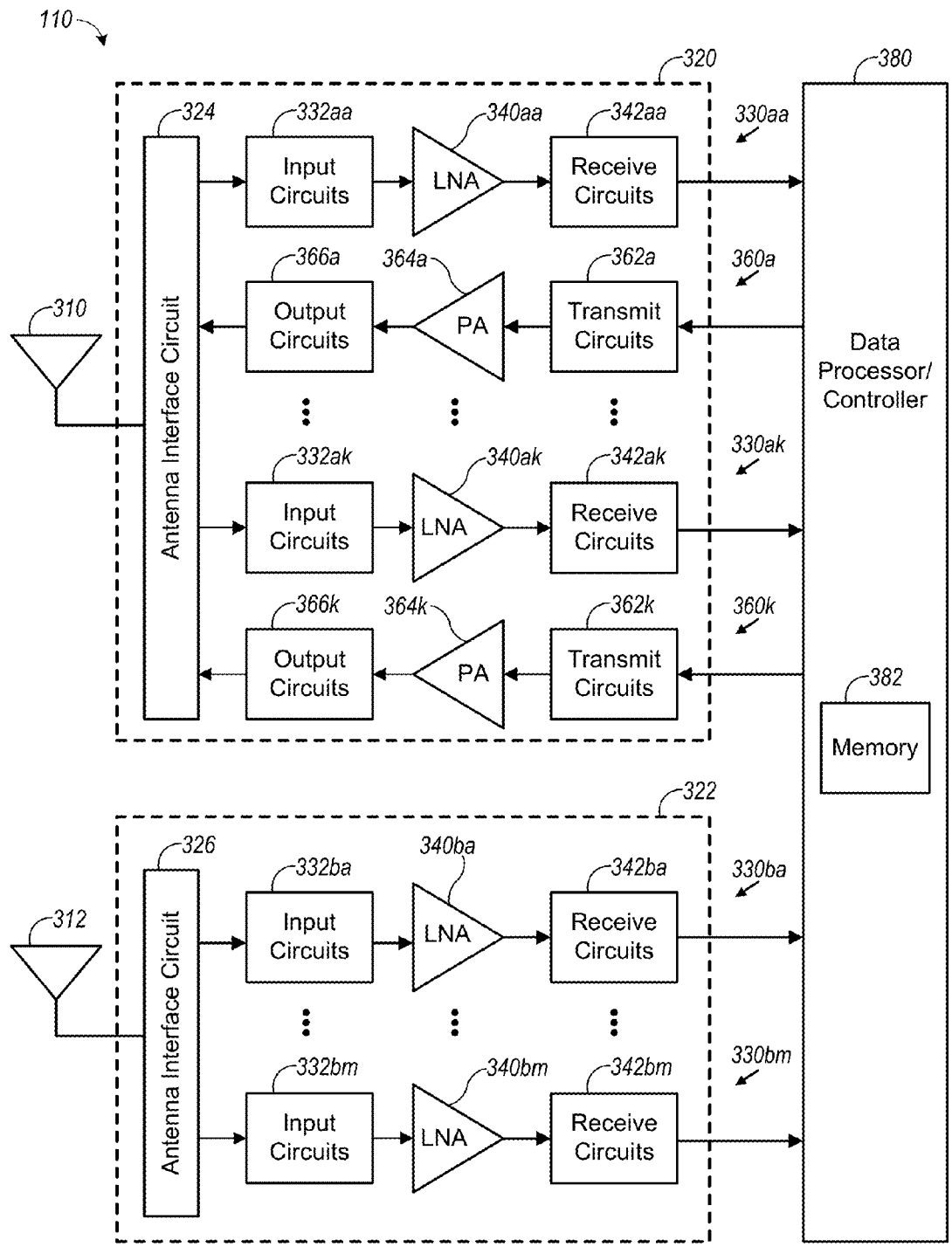
FIG. 3 shows a block diagram of the wireless device in FIG. 1, according to an aspect of the present disclosure.

FIG. 3 shows a block diagram of an exemplary design of the wireless device 110 in FIG. 1. In this exemplary design, the wireless device 110 includes a transceiver 320 coupled to a primary antenna 310, receiver 322 coupled to a secondary antenna 312, and a data processor/controller 380. The transceiver 320 includes multiple (K) receivers 330aa to 330ak and multiple (K) transmitters 360a to 360k to support multiple bands, carrier aggregation, multiple radio technologies, etc. The receiver 322 include multiple (M) receivers 330ba to 330bm to support multiple bands, carrier aggregation, multiple radio technologies, receive diversity, MIMO transmission from multiple transmit antennas to multiple receive antennas, etc.

In the exemplary design shown in FIG. 3, each receiver 330 includes input circuits 332, a low-noise amplifier (LNA) 340, and receive circuits 342. For data reception, the antenna 310 receives signals from base stations and/or other transmitter stations and provides a received radio frequency (RF) signal, which is routed through an antenna interface circuit 324 and provided to a selected receiver. The antenna interface circuit 324 may include switches, duplexers, transmit filters, receive filters, etc. The description below assumes that the receiver 330aa is the selected receiver. Within the receiver 330aa, the received RF signal is passed through input circuits 332aa, which provides an input RF signal to an LNA 340aa. Input circuits 332aa may include a matching circuit, a receive filter, etc. The LNA 340aa amplifies the input RF signal and provides an output RF signal. Receive circuits 342aa amplify, filter, and downconvert the output RF signal from RF to baseband and provide an analog input signal to a data processor 380. Receive circuits 332aa may include mixers, filters, amplifiers, matching circuits, an oscillator, a local oscillator (LO) generator, a phase locked loop (PLL), etc. Each remaining receiver 330 in the transceiver 320 and each receiver 330 in the receiver 322 may operate in similar manner as the receiver 330aa in the transceiver 320.

In the exemplary design shown in FIG. 3, each transmitter 360 includes transmit circuits 362, a power amplifier (PA) 364, and output circuits 366. For data transmission, the data processor 380 processes (e.g., encodes and modulates) data to be transmitted and provides an analog output signal to a selected transmitter. The description below assumes that transmitter 360a is the selected transmitter. Within the transmitter 360a, transmit circuits 362a amplify, filter, and upconvert the analog output signal from baseband to RF and provide a modulated RF signal. Transmit circuits 362a may include amplifiers, filters, mixers, matching circuits, an oscillator, an LO generator, a PLL, etc. A PA 364a receives and amplifies the modulated RF signal and provides a transmit RF signal having the proper output power level. The transmit RF signal is passed through output circuits 366a, routed through the antenna interface circuit 324, and transmitted via the antenna 310. Output circuits 366a may include a matching circuit, a transmit filter, a directional coupler, etc.

FIG. 3 shows an exemplary design of receivers 330 and transmitters 360. A receiver and a transmitter may also include other circuits not shown in FIG. 3, such as filters, matching circuits, etc. All or a portion of the transceiver 320 and the receiver 322 may be implemented on one or more analog integrated circuits (ICs), RF ICs (RFICs), mixed-signal ICs, etc. For example, LNAs 340, receive circuits 342, and transmit circuits 362 may be implemented on one module, which may be an RFIC, etc. Antenna interface circuits 324 and 326, input circuits 332, output circuits 366, and PAs 364 may be implemented on another module, which may be a hybrid module, etc. The circuits in the transceiver 320 and the receiver 322 may also be implemented in other manners.

The data processor/controller 380 may perform various functions for the wireless device 110. For example, the data processor 380 may perform processing for data being received via the receivers 330 and data being transmitted via the transmitters 360. The controller 380 may control the operation of antenna interface circuits 324 and 326, input circuits 332, LNAs 340, receive circuits 342, transmit circuits 362, PAs 364, output circuits 366, or a combination thereof. A memory 382 may store program codes and data for the data processor/controller 380. The data processor/controller 380 may be implemented on one or more application specific integrated circuits (ASICs) and/or other ICs.

The wireless device 110 may receive transmissions from one or more base stations/cells on multiple carriers at different frequencies for carrier aggregation. For intra-band CA, the transmissions are sent on different carriers in the same band. For inter-band CA, the transmissions are sent on multiple carriers in different bands.

Figure 4:
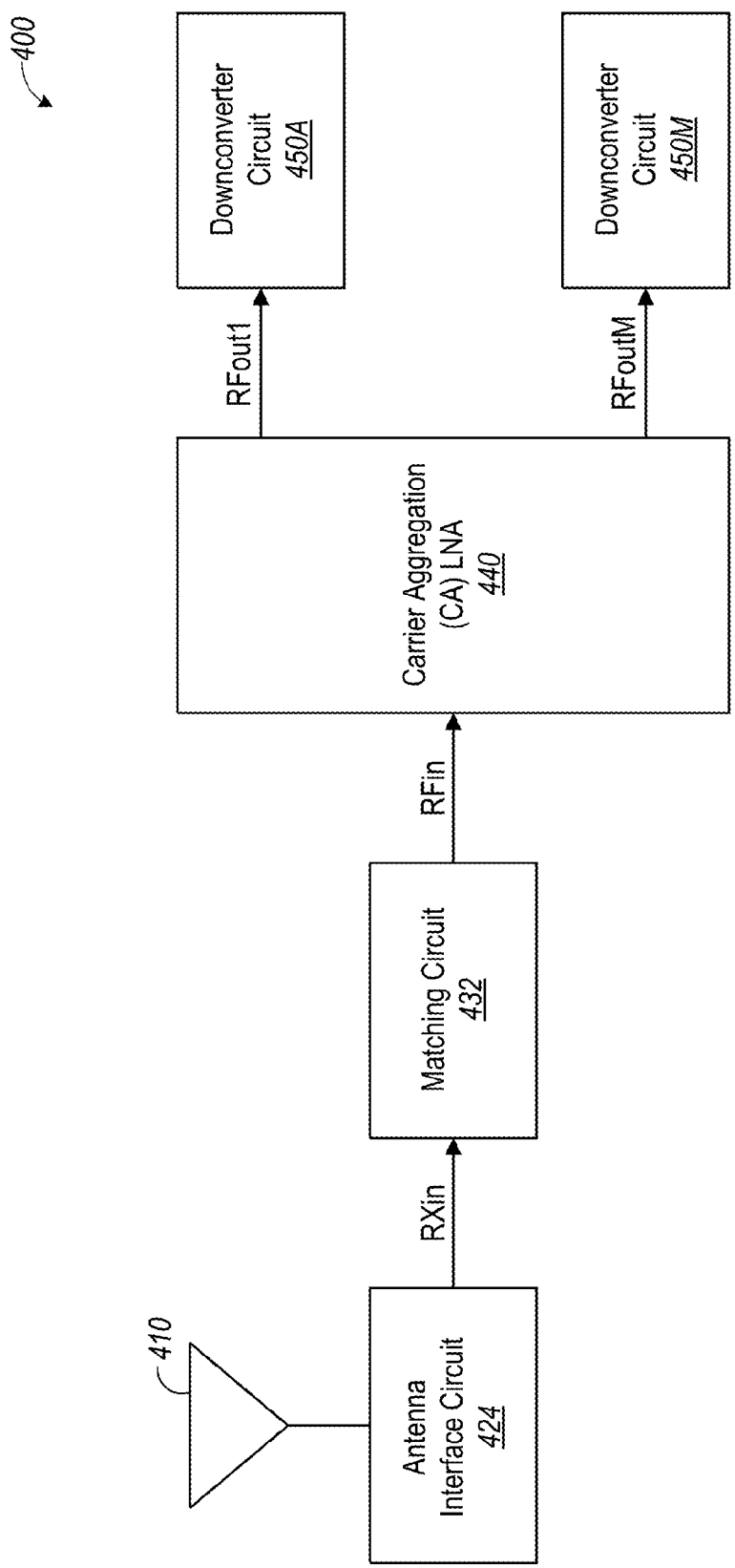
FIG. 4 shows a receiver supporting carrier aggregation (CA), in accordance with an aspect of the present disclosure.

FIG. 4 shows a block diagram of an exemplary design of a receiver 400 with a carrier aggregation (CA) low-noise amplifier (LNA) 440 configured to support intra-band or inter-band CA. The CA LNA 440 may be used for one or more LNAs 340 shown in FIG. 3. The CA LNA 440 includes single input and multiple (M) outputs, where M>1.

At the receiver 400, an antenna 410 may receive downlink signals comprising one or more transmissions sent on one or more carriers and provide a received radio frequency (RF) signal to an antenna interface circuit 424. The antenna interface circuit 424 may filter and route the received RF signal and provide a receiver input signal, RXin. An input matching circuit 432 may receive the RXin signal and provide an input RF signal, RFin, to the CA LNA 440. A matching circuit 432 may perform impedance and/or power matching between the CA LNA 440 and either the antenna interface circuit 424 or the antenna 410 for a band of interest. The matching circuit 432 may be part of one of the input circuits 332 in FIG. 3.

The CA LNA 440 may receive and amplify the input RFin signal and provide (i) one output RF signal via one LNA output for either no CA or CA on one set of carriers or (ii) up to M output RF signals, RFout1 to RFoutM, via up to M LNA outputs for intra-band CA on up to M sets of carriers. In some aspects, the receiver 400 may comprise a wideband LNA with a bandwidth defined to accommodate or facilitate inter-band CA using an LNA. For example, the CA LNA 440 may receive multiple inputs and generate multiple outputs to support inter-band carrier aggregation within one LNA, which utilizes wide matching bandwidth and also limits the isolation between inter-band carriers. M downconverter circuits 450A to 450M are coupled to the M LNA outputs. Each downconverter circuit 450, when enabled, may downconvert an associated output RF signal such that one or more transmissions on one or more carriers of interest are downconverted from RF to baseband.

A CA LNA, such as the CA LNA 440 in FIG. 4, may operate in a single-output mode or a multi-output mode at any given moment. In the single-output mode, the CA LNA operates in a 1-input to 1-output (1×1) configuration, and receives one input RF signal comprising one or more transmissions on one set of carriers, and provides one output RF signal to one downconverter circuit. The single-output mode may be used to receive a transmission sent on a single carrier without carrier aggregation. The single-output mode may also be used to receive transmissions sent on multiple carriers (e.g., contiguous carriers) with carrier aggregation. In this case, the transmissions on all carriers may be downconverted with a single local oscillator (LO) signal at a single frequency. In the multi-output mode, the CA LNA operates in a 1×M configuration, receives one input RF signal comprising multiple transmissions on M sets of carriers, and provides M output RF signals to M downconverter circuits, one output RF signal for each set of carriers, where M>1. Each set of carriers may include one or more carriers in a single band (e.g., intra-band CA) or across multiple bands (e.g., inter-band CA).

Multistage Low-Noise Amplifier (LNA) with Bandpass Frequency Response

The increasing consumer cost-sensitivity and the increasing cost of advanced semiconductor technology nodes may make inductively loaded low-noise amplifiers (LNAs) (including transformer loaded) unaffordable. With multiple-input multiple output (MIMO) technology and carrier aggregation, the number of resonant LNA loads may increase drastically. The inductive/resonant loads help to reduce the gain of out-of-band signals (e.g., signals separate from those carrying information used for conducting a call) with little performance penalty in-band (e.g., frequencies that carry information such as a talk path). Without them, the gain at ultra-low frequencies is extremely high and can result in issues with out-of-band (OOB) linearity for low frequency jammers, reciprocal mixing with low frequency noise in frequency division duplex (FDD) systems, and stability. Unfortunately, inductors do not scale well with technology but instead have become more expensive.

Inductor-less LNAs have been used to address area and cost concerns. However, conventional inductor-less LNAs have poor frequency response due to extremely high gain at low frequencies. This problem is exacerbated with multi-stage designs—where the effect is compounded with each additional stage. Low frequencies jammers and noise are amplified more than the desired signal and hit the second stage harder, placing strict requirements on the linearity of the second stage. Furthermore, inductor-less filtering techniques exhibit performance degradation with respect to noise, linearity, isolation and other performance metrics, which limit widespread use.

Aspects of the present disclosure are directed to inter-stage high pass filtering for a multistage LNA. Inter-stage high pass filtering beneficially provides for in-band performance that is unaffected, while out-of-band signals are rejected. In some aspects, the inter-stage high pass filtering may be provided using passive components (passive implementation) or active components (active implementation). Active implementations, however, may provide superior rejection of unwanted out-of-band signals and noise as compared to a passive implementation. Furthermore, the inter-stage high pass filter may be implemented with multiple poles to further increase the rejection of low frequencies. Additionally, in-band performance degradations may be reduced or in some cases eliminated because the circuit is not operational at in-band frequencies (as opposed to conventional solutions that have circuitry operational in-band).

Figure 5A:
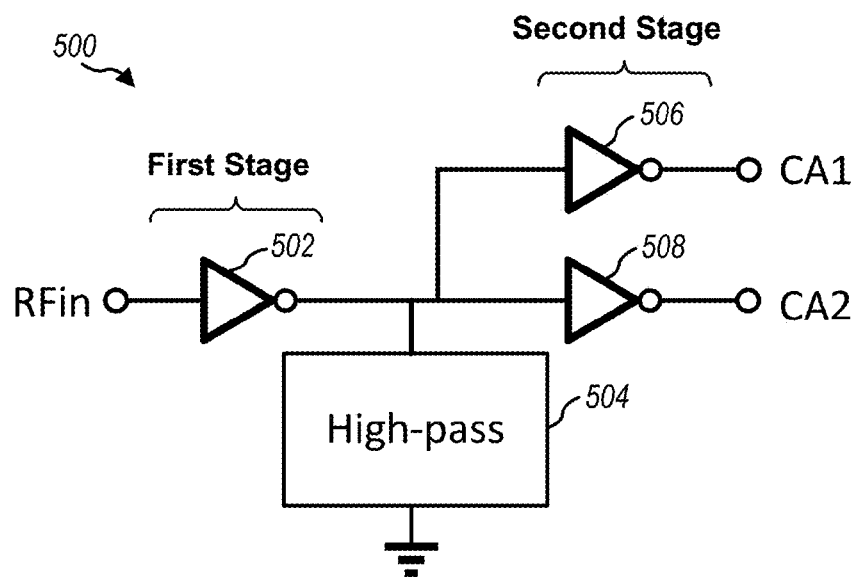
FIG. 5A is a block diagram illustrating a multi-stage low-noise amplifier (LNA) with bandpass frequency response in accordance with aspects of the present disclosure.

FIG. 5A is a block diagram illustrating a multi-stage low-noise amplifier (LNA) 500 with bandpass frequency response in accordance with aspects of the present disclosure. The multi-stage LNA 500 may be configured with a first stage LNA 502 to receive a radio frequency (RF) signal RFin as an input. The multi-stage LNA 500 also includes a second stage of LNAs. The second stage of LNAs may comprise one or more LNAs (e.g., 506 and 508) to output a signal for one or more carriers (e.g., CA1 and CA2). The multi-stage LNA 500 is also configured with a high pass filter 504 inter-stage between the first stage LNA and the second stage LNAs. Because the LNAs of the first stage have a natural roll off (e.g., as frequency increases, the gain decreases), the LNAs of the first stage (e.g., 502) may effectively low pass filter the RFin signal, thus providing a low pass response. The output of the first stage LNA 502 is high pass filtered via a high pass filter 504 and supplied to the second stage LNAs 506, 508 for output via carriers CA1 (e.g., 2 GHz) and CA2 (e.g., 2.1 GHz) and then downconverted via a downconverter circuit (e.g., 450A-M). The second stage LNAs (e.g., 506, 508) may also have low pass response. By adding the high pass filter 504, a band pass response may be achieved.

Figure 5B:
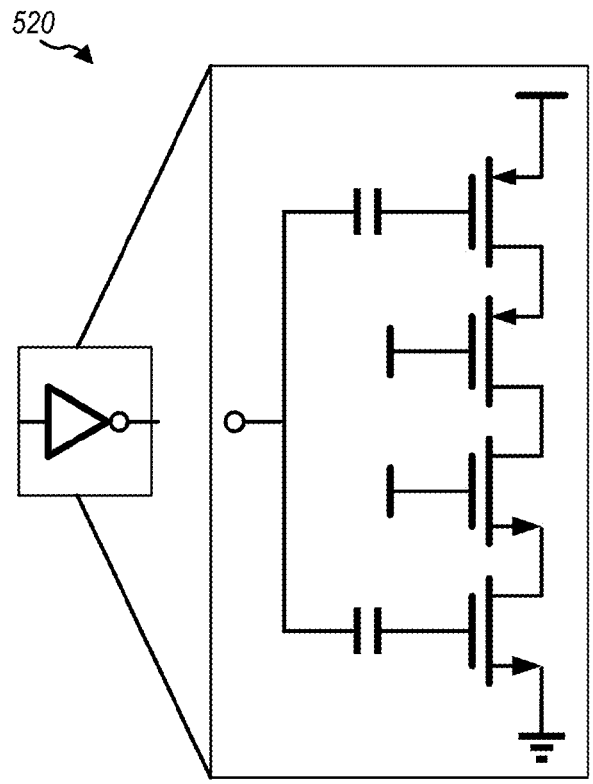
FIG. 5B illustrates an exemplary inductor-less low-noise amplifier (LNA) in accordance with aspects of the present disclosure.

In some aspects, each of the LNAs of the multi-stage LNA 500 may be configured without inductors. FIG. 5B illustrates an exemplary inductor-less LNA 520 in accordance with aspects of the present disclosure. As shown in the example of FIG. 5B, the inductor-less LNA 520 may comprise a complimentary cascaded amplifier. Of course, this is merely exemplary and non-limiting.

Figure 5C:
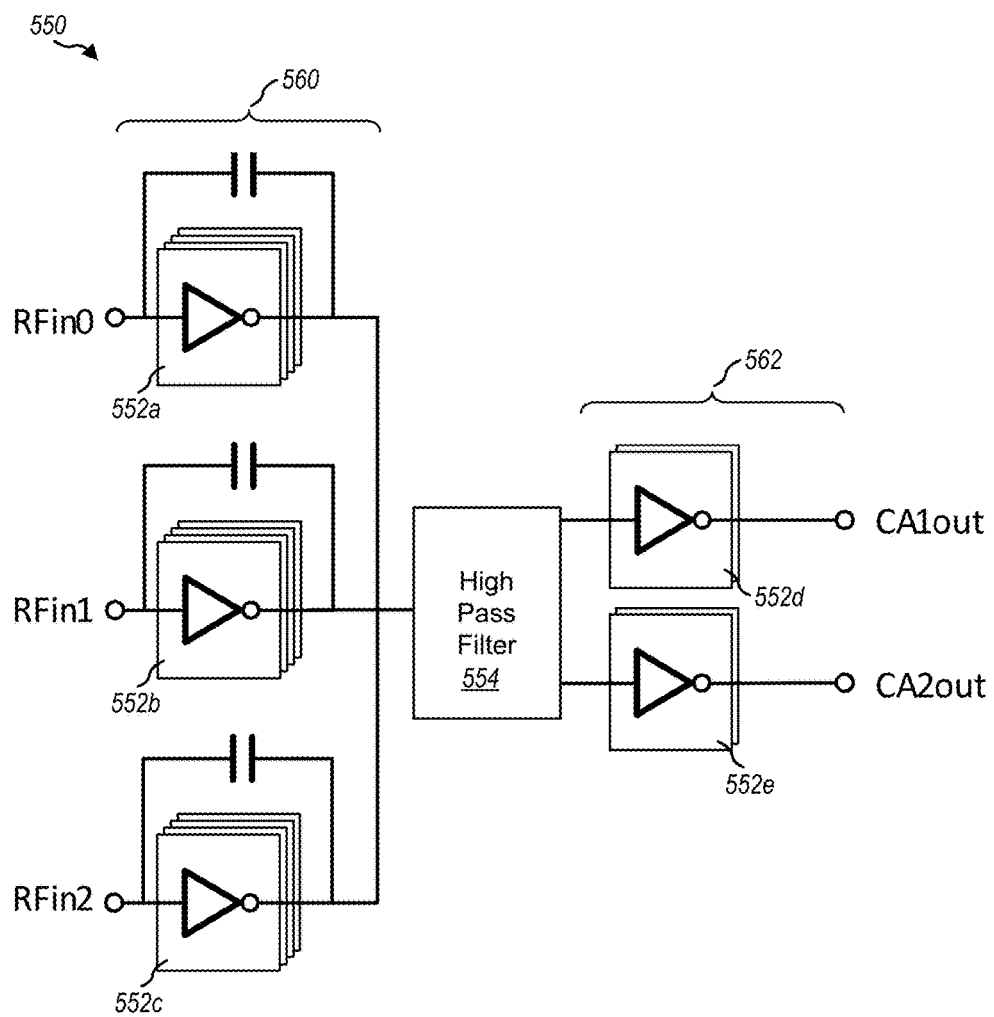
FIG. 5C is a diagram illustrating a multi-stage low-noise amplifier (LNA) in accordance with aspects of the present disclosure.

FIG. 5C is a diagram illustrating a multi-stage LNA 550 in accordance with aspects of the present disclosure. The multi-stage LNA 550 includes a first stage 560 and a second stage 562. Although, two stages are shown, this is merely for ease of explanation and illustration and non-limiting as other numbers of stages are also contemplated. The multi-stage LNA 550 also includes a high pass filter 554 coupled between the first stage 560 and the second stage 562.

As shown in FIG. 5C, the multi-stage LNA 550 may also include multiple inputs (e.g., RFin0, RFin1, and RFin2) and multiple outputs (e.g., CA1out and CA2out). In addition, the first stage 560 and the second stage 562 may both include multiple LNAs (e.g., 552*a-e*). Each of the LNAs (e.g., 552*a-e*) may include multiple slices that may be used for gain programmability, for example.

Each of the multiple inputs (e.g., RFin0, RFin1, and RFin2) of LNA 550 may correspond to a different frequency band. Although three inputs are shown, this is merely exemplary and not limiting. Each of the multiple outputs, on the other hand, may correspond to a different carrier (e.g., CA1out, CA2out). In some aspects, only one of the inputs may be active at one time, while may outputs may be active. The LNA 550 has one first stage 560 per input and one second stage 562 per output. Each stage may have an intrinsic wide-band low pass response. The output of the first stage 560 is high pass filtered by applying the high pass filter 554 to the output of the first stage 560. The high pass filtered output may be supplied to the second stage 562 and output via the carriers (e.g., CA1out and CA2out). As a result, a band pass response is produced.

Figure 6A:
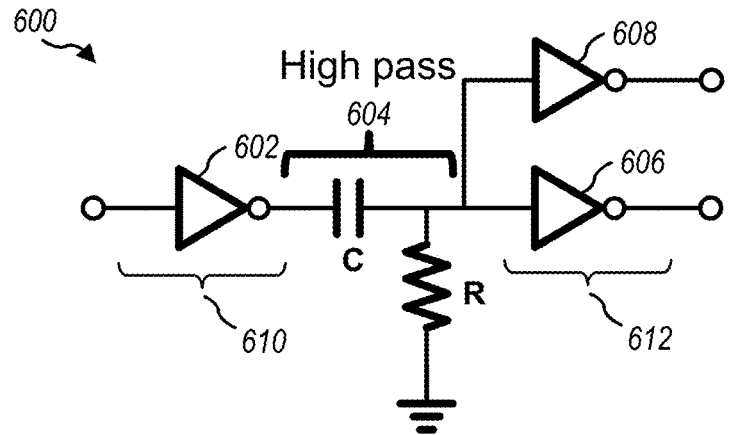
FIGS. 6A and 6B are diagrams illustrating exemplary implementations of the multi-stage low-noise amplifier (LNA) in accordance with aspects of the present disclosure.
Figure 6B:
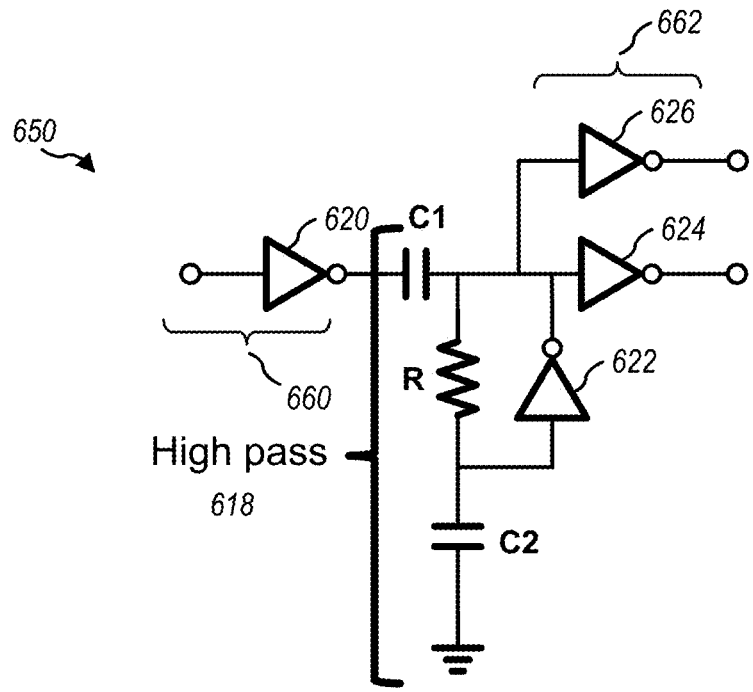

FIGS. 6A and 6B are diagrams illustrating exemplary implementations of a multi-stage LNA in accordance with aspects of the present disclosure. In FIG. 6A, a passive implementation of the multi-stage LNA 600 is presented.

As shown in FIG. 6A, the multi-stage LNA 600 may be configured with a first stage 610 that includes a first stage LNA 602 to receive a radio frequency (RF) signal RFin as an input. The multi-stage LNA 600 also includes a second stage 612 that includes second stage LNAs 606, 608. The second stage of LNAs may include one or more LNAs (e.g., 606 and 608) to output a signal for one or more carriers (e.g., CA1 and CA2).

The multi-stage LNA 600 is also configured with a high pass filter 604 between the first stage LNA 602 and the second stage LNAs 606, 608. The high pass filter 602 may be configured with passive components, such as a capacitor C in series with a resistor R. The high pass filter 604 may further be configured with the pole set out-of-band to avoid impacting in-band performance. As such, the circuitry may appear 'open' (e.g., have high impedance) at in-band frequencies to minimize in-band performance degradation, but low-impedance at very low frequencies to reduce the gain. For example, in FIG. 6A, for in-band, the resistance of resistor R may be much larger than the impedance of capacitor C.

Because the LNAs of the first stage 610 have a natural roll off (e.g., as frequency increases, the gain decreases), the LNAs of the first stage 610 may effectively low pass filter the RFin signal, thus providing a low pass response. The output of the first stage LNA 602 is high pass filtered via a high pass filter 604 and supplied to the second stage LNAs 606, 608 for output via carriers CA1(e.g., 2 GHz) and CA2 (e.g., 2.1 GHz) and then downconverted by a downconverter circuit (e.g., 450A-M). By adding the high pass filter 604, a band pass may be achieved. The second stage LNAs 606, 608 have an inherent low pass response.

On the other hand, FIG. 6B illustrates an active implementation of the multi-stage LNA 650. As shown in FIG. 6B, the multi-stage LNA 650 may be configured with a first stage 660 that includes a first stage LNA 620 to receive a radio frequency (RF) signal RFin as an input. The multi-stage LNA 650 also includes a second stage 662 that includes second stage LNAs 624, 626. The second stage of LNAs may include one or more LNAs (e.g., 606 and 608) to output a signal for one or more carriers (e.g., CA1 and CA2).

The multi-stage LNA 650 may further have a high pass filter 618 that includes a pair of capacitors (e.g., C1 and C2), a resistor R, and an active component, such as an inverting amplifier 622. The first stage LNA 620 may receive an input signal (e.g., radio frequency signal). The input signal is amplified and supplied as output to a high pass filter 618. The first stage output is low pass filtered by a resistor capacitor (RC) circuit, such as RC circuit (RC1). RC circuit (RC2) acts to filter out high frequency components of the first stage output that remain following the low pass filtering which are to be preserved. That is, the resistor R and the inverting amplifier 622 may form the shunt portion of the high pass filter 618. The low frequency components of the first stage output are supplied to the inverting amplifier 622. The inverting amplifier 622 inverts and amplifies the low pass filtered output and combines or adds it back with the first stage output. In doing so, low frequency components of the first stage output are canceled.

In some aspects, the shunt portion may have the frequency response of the inductor and may be referred to as an active inductor. That is, the shunt elements are open when the frequency is high. Notably, impedance looking through the shunt is high (e.g., high shunt impedance) in-band and low (e.g., low shunt impedance) at low frequencies where the intrinsic amplifier gain is excessive.

In conventional inductor-less approaches, the circuitry is active at RF frequencies and thus, contributes to in-band noise and linearity performance. In contrast, in accordance with aspects of the present disclosure, the circuit is configured such that the impedance is high at RF frequencies (e.g., current does not flow through the shunt elements and the circuit does not attenuate an RF signal or create intermodulation products) and thus limits the performance impact.

Figure 7A:
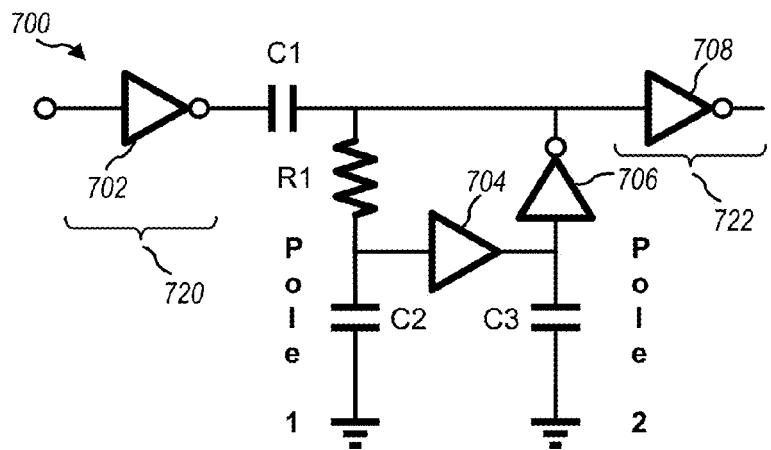
FIGS. 7A, 7B, and 7C are diagrams illustrating an exemplary multi-stage low-noise amplifier (LNA) including a high pass filter with multiple poles in accordance with aspects of the present disclosure.
Figure 7B:
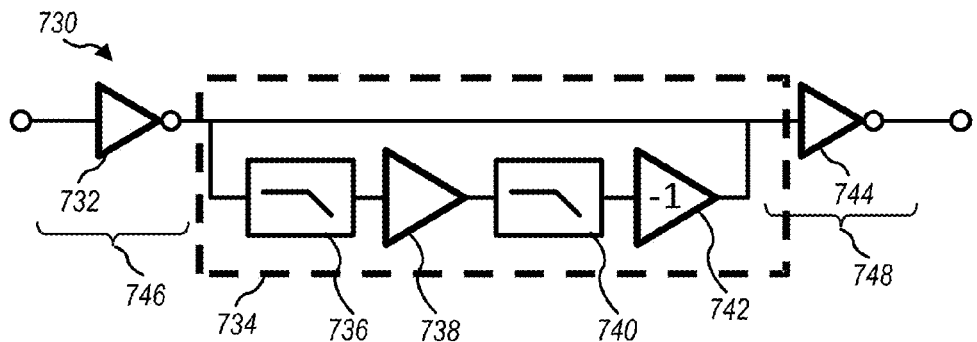
Figure 7C:
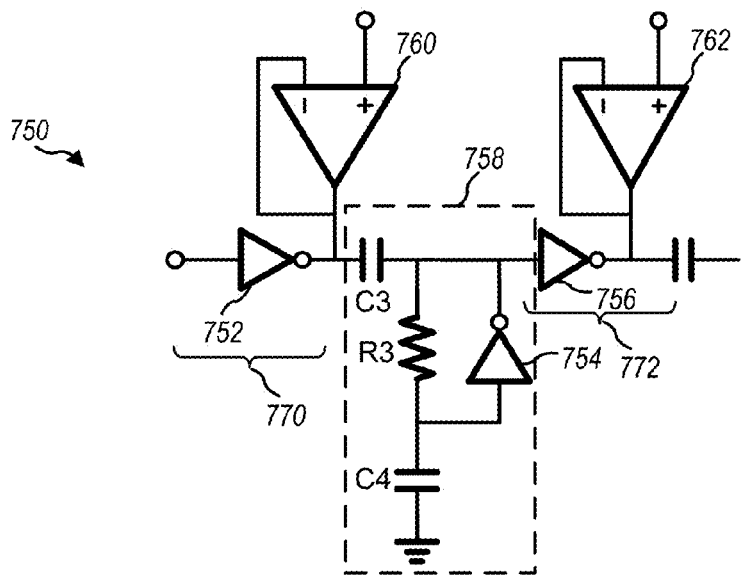

FIGS. 7A-C are diagrams illustrating an exemplary multi-stage LNA 700 including a high pass filter with multiple poles (pole 1 and pole 2) in accordance with aspects of the present disclosure. Referring to FIG. 7A, a two pole active implementation is shown. The multi-stage LNA 700 may include a first stage LNA 702 at a first stage 720, and a second stage LNA 708 at a second stage 722. The high pass filter includes cascaded low pass filters along with a buffer 704 and an inverting amplifier 706. The output of the first stage is filtered by the RC filter (e.g., R1 and C1), then buffered via buffer 704. The output of RC filter is then filtered again by the second capacitor C2 and the buffer's intrinsic output impedance. The buffer output is then inverted and amplified via inverting amplifier 706 and then added back to the original output of the first stage—essentially cancelling the low frequency signals which passed through the low pass filters. The high frequencies which did not pass through the filters are unaffected.

FIG. 7B illustrates a simplified block diagram of the multi-stage LNA 700 shown in FIG. 7A. As shown in FIG. 7B, the multi-stage LNA 730 may include a first stage LNA 732 at a first stage 746, and a second stage LNA 744 at a second stage 748. The multi-stage LNA 730 may also have a high pass filter 734 that includes a first low pass filter 736, a buffer 738, a second low pass filter 740, and an inverter 742 in series. The low pass filters 736, 740 may be second order low pass filters. The second order low pass filter is provided in the feedback and thus provides a high frequency response. The high frequency response may be given by:

$$\frac{\left(1+\frac{s}{\omega_{p1}}\right)\left(1+\frac{s}{\omega_{p2}}\right)}{\left(1+\frac{s}{\omega_{p1}}\right)\left(1+\frac{s}{\omega_{p2}}\right)+A_v}$$

where s is the frequency of the RF input signal (e.g., RFin), $\omega_{p1}$ is the frequency at the first pole, $\omega_{p2}$ is the frequency at the second pole, and $A_v$ is the voltage amplification or voltage gain of the entire feedback loop.

FIG. 7C is a diagram illustrating a three pole active implementation for a multi-stage LNA 750. As shown in FIG. 7C, the multi-state LNA 750 may include a first stage LNA 752 at a first stage 770, and a second stage LNA 756 at a second stage 772. Three cascaded high pass poles are also provided. The additional poles are provided by a bias loop, which also fixes a drain voltage, further increasing rejection. In the circuit of FIG. 7C, the two op-amps in feedback (e.g., 760 and 762) serve to fix the bias point at the output of the amplifiers. Since the op-amps have a finite bandwidth, they may only suppress frequencies within their bandwidth. High frequencies are unaffected. The circuit 758 in the center again cancels just the low frequency signals which have passed through the RC circuit (e.g., R3 and C3) as discussed in FIG. 7A. The circuit 758 includes an inverting amplifier 754 that inverts and amplifies the low pass filtered output supplied via the RC circuit (R3C3.) The inverted and amplified output of circuit 758 is combined with the output of the first stage 770 thereby canceling the low frequency components of the first stage output. Notably, each of the elements of the circuit 758 provides a pole, and thus a further degree of rejection.

Figure 8:
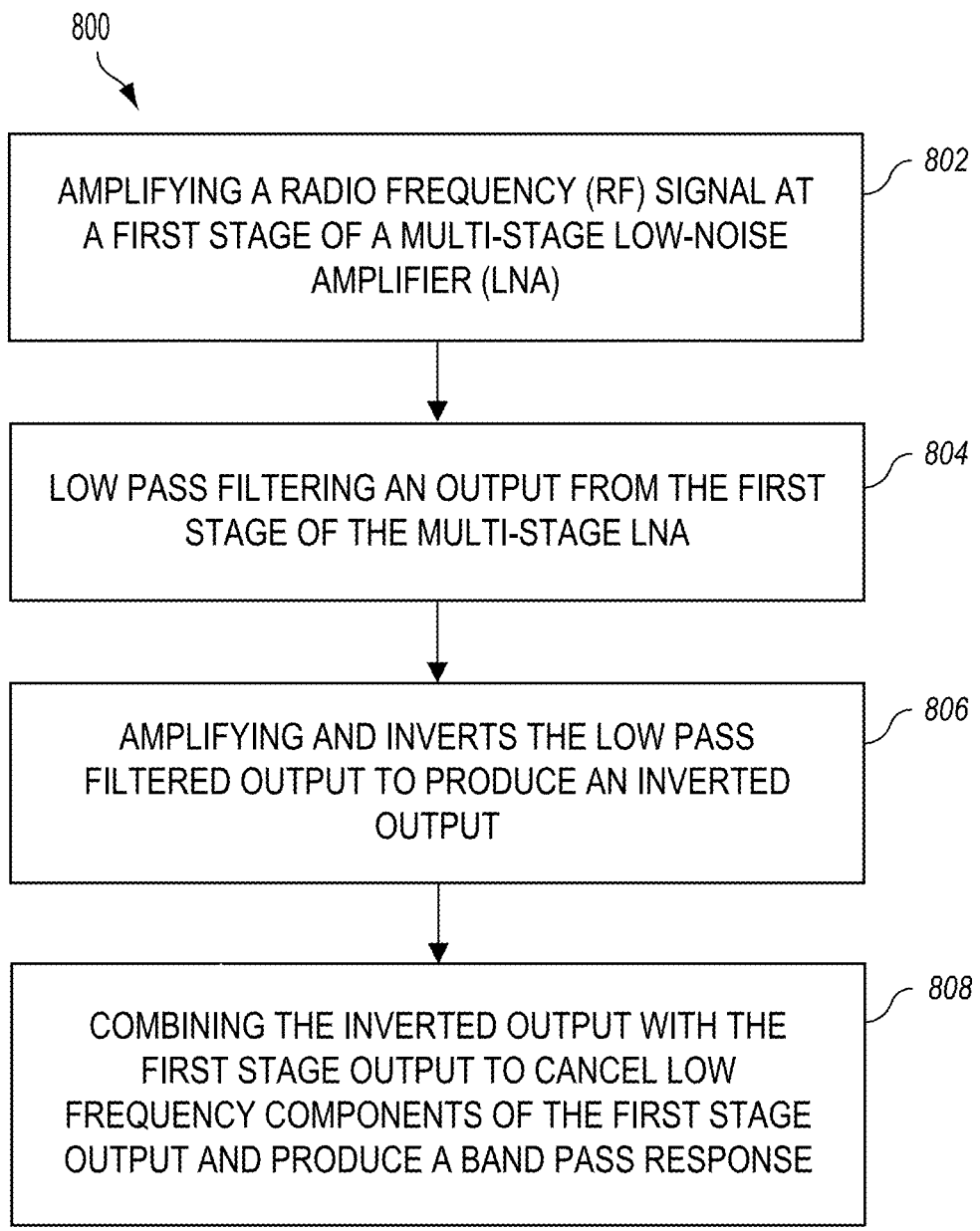
FIG. 8 is a flow diagram illustrating a method of processing a radio frequency (RF) signal, in accordance with aspects of the present disclosure.

FIG. 8 is a flow diagram illustrating a method of wireless communication 800, in accordance with aspects of the present disclosure. At block 802, the process amplifies a radio frequency signal at a first stage of a multi-stage low-noise amplifier (LNA). At block 804, the process low pass filters an output from the first stage of the multi-stage LNA. At block 806, the process amplifies and inverts the low pass filtered output to produce an inverted output. At block 808, the process combines the inverted output with the first stage output to cancel low frequency components of the first stage output and produce a band pass response.

In some aspects, the process also receives multiple inputs at the first stage, each of the inputs comprising a different radio frequency band. Furthermore, in some aspects, the process amplifies the combined output at a second stage of the multi-stage LNA to generate multiple second stage outputs, each of the second stage outputs corresponding to a different carrier.

According to a further aspect of the present disclosure, a multi-stage LNA is described. The multi-stage LNA includes means for amplifying a radio frequency signal. The means for amplifying may, for example, include the LNA 502 or LNA 520, as shown in FIGS. 5A and 5B, respectively. The multi-stage LNA may also include means for low pass filtering an output from a first stage of the multi-stage LNA. The filtering means may, for example, include the RC circuit of FIG. 6A or 6B. The multi-stage LNA may further include means for amplifying and inverting the low pass filtered output to produce an inverted output. The means for amplifying and inverting may, for example, include the inverter 622 as shown in FIG. 6B or the LNA 624 or 626. The multi-stage LNA may further include means for combining the inverted output with the first stage output to cancel low frequency components of the first stage output. The means for combining may, for example, include the inverter 622 of FIG. 6B. The multi-stage LNA may further include means for receiving multiple inputs at the first stage, each of the multiple inputs comprising a different radio frequency band. The means for receiving multiple inputs may, for example, include first stage LNAs 552a-c as shown in FIG. 5C. The multi-stage LNA may further include means for suppressing a portion of the output from the first stage, and a portion of the combined output at a second stage. The means for suppressing may, for example, include operational amplifiers 760 or 762 as shown in FIG. 7C. In another aspect, the aforementioned means may be any layer, module, or any apparatus configured to perform the functions recited by the aforementioned means.

Figure 9:
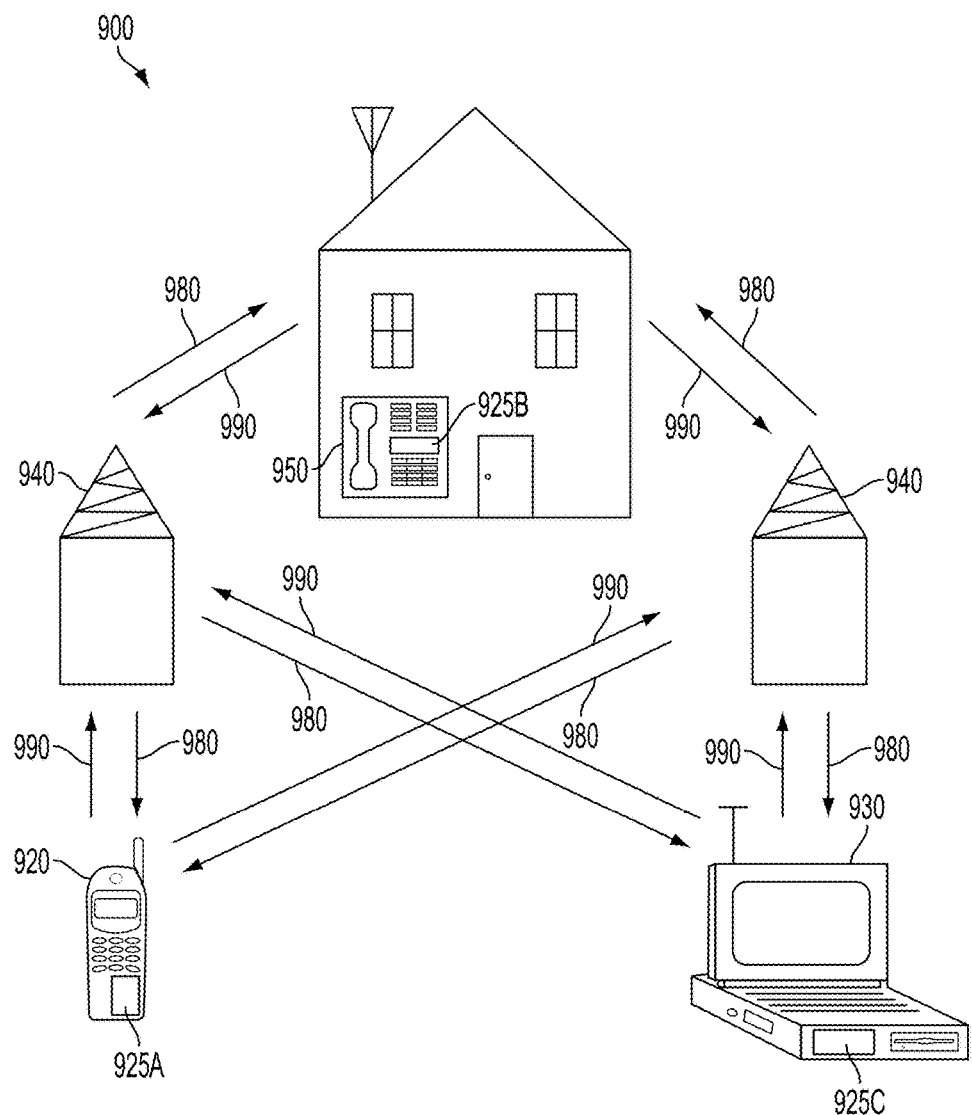
FIG. 9 is a block diagram showing an exemplary wireless communication system in which an aspect of the disclosure may be advantageously employed.

FIG. 9 is a block diagram showing an exemplary wireless communication system 900 in which an aspect of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C, and 925B that include the disclosed RF filter. It will be recognized that other devices may also include the disclosed RF filter, such as the base stations, user equipment, and network equipment. FIG. 9 shows forward link signals 980 from the base station 940 to the remote units 920, 930, and 950 and reverse link signals 990 from the remote units 920, 930, and 950 to base station 940.

In FIG. 9, remote unit 920 is shown as a mobile telephone, remote unit 930 is shown as a portable computer, and remote unit 950 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the disclosed RF filter.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. A multi-stage low-noise amplifier (LNA) device with a band pass response, comprising:
    a first LNA stage in series with a second LNA stage, the first LNA stage having a plurality of inputs, each of the plurality of inputs corresponding to a different frequency band, the second LNA stage comprising a plurality of parallel LNAs;
    a plurality of outputs coupled to the second LNA stage, each of the plurality of outputs capable of being active at a same time; and
    a high pass filter coupled between the first LNA stage and the second LNA stage.

2. The device of claim 1, in which the high pass filter is passive.

3. The device of claim 1, in which the high pass filter is active.

4. The device of claim 3, in which the high pass filter comprises a low pass filter and an inverting amplifier.

5. The device of claim 4, in which the high pass filter comprises a plurality of low pass filters (LPFs).

6. The device of claim 1, in which the high pass filter comprises a resistor capacitor (RC) circuit.

7. The device of claim 1, in which the first LNA stage and the second LNA stage are inductor-less.

8. The device of claim 1, in which each of the plurality of outputs corresponds to a different carrier.

9. The device of claim 1, in which only one input is active at one time.

10. The device of claim 1, in which the high pass filter is configured to present a high shunt impedance at in-band frequencies and a low shunt impedance at low frequencies.

11. A method of wireless communication, comprising:
    amplifying multiple inputs at a first stage of a multi-stage low-noise amplifier (LNA), each of the multiple inputs comprising a different radio frequency band;
    low pass filtering, through two low pass filters in series, an output from the first stage of the multi-stage LNA to generate a low pass filtered output;
    amplifying and inverting the low pass filtered output to produce an inverted output; and
    combining the inverted output with the output from the first stage to generate a combined output to cancel low frequency components of the output of the first stage and produce a band pass response.

12. The method of claim 11, further comprising amplifying the combined output at a second stage of the multi-stage LNA to generate multiple second stage outputs, each of the second stage outputs corresponding to a different carrier.

13. A multi-stage low-noise amplifier (LNA) apparatus with a band pass response, comprising:
    means for amplifying a plurality of inputs at a first stage of the multi-stage LNA, each of the plurality of inputs comprising a different radio frequency band;
    means for low pass filtering, through two low pass filters in series, an output from the first stage of the multi-stage LNA to generate a low pass filtered output;
    means for amplifying and inverting the low pass filtered output to produce an inverted output; and
    means for combining the inverted output with the output of the first stage to generate a combined output to cancel low frequency components of the output of the first stage.

14. The apparatus of claim 13, further comprising means for amplifying the combined output at a second stage of the multi-stage LNA to generate a plurality of second stage outputs, each of the second stage outputs corresponding to a different carrier.

15. The apparatus of claim 13, further comprising means for suppressing the output from the first stage.

16. The apparatus of claim 13, further comprising means for suppressing the combined output at a second stage.

17. The apparatus of claim 16, in which some frequencies are unaffected.

* * * * *